(12) United States Patent
Tuominen et al.

(10) Patent No.: US 6,344,167 B1
(45) Date of Patent: Feb. 5, 2002

(54) PROCESS FOR THE PRODUCTION OF SUPERCONDUCTOR CONTAINING FILAMENTS

(75) Inventors: Olli P. Tuominen, Candler; Matthew B. Hoyt, Arden; David F. Mitchell, Asheville; Carol W. Morgan, Asheville; Clyde Gordon Roberts, Asheville; Robert A. Tyler, Canton, all of NC (US)

(73) Assignee: BASF Corporation, Mt. Olive, NJ (US)

( * ) Notice: Subject to any disclaimer, the term of this patent is extended or adjusted under 35 U.S.C. 154(b) by 0 days.

(21) Appl. No.: 08/198,936

(22) Filed: Feb. 18, 1994

(51) Int. Cl.$^7$ .......................... B29C 17/00; C04B 33/32; H01L 39/24
(52) U.S. Cl. .................. 264/642; 264/638; 264/656; 264/669; 264/674; 264/108; 264/171.1; 419/2; 419/4; 505/430
(58) Field of Search .................. 264/63, 56, 65, 264/108, 171.1, 209.3, 210.2, 211, 614, 638, 639, 642, 656, 669, 674; 505/430; 419/2, 4

(56) References Cited

U.S. PATENT DOCUMENTS

| 2,428,046 A | 9/1947 | Sisson et al. |
| 4,166,147 A | 8/1979 | Lange et al. ............... 428/328 |
| 4,207,226 A | 6/1980 | Storm ........................ 260/38 |
| 4,250,131 A | 2/1981 | Sobel et al. ................ 264/56 |
| 4,342,712 A | 8/1982 | Yajima et al. .............. 264/63 |
| 4,559,191 A | 12/1985 | Arons ........................ 264/60 |
| 4,863,799 A | 9/1989 | Mininni et al. ............ 428/373 |
| 4,988,671 A | 1/1991 | Johnson ........................ 505/1 |
| 5,006,504 A | 4/1991 | O'Brien ........................ 505/1 |
| 5,023,231 A | 6/1991 | Hsu ............................ 505/1 |
| 5,112,801 A | 5/1992 | Nellis et al. .................. 505/1 |
| 5,166,130 A | 11/1992 | Enomoto et al. ............. 505/1 |

FOREIGN PATENT DOCUMENTS

| BE | 633357 | 12/1963 |
| BR | 8702412 | 1/1989 |
| EP | 0248432 | 12/1987 |
| EP | 0384785 | 8/1990 |
| EP | 0401014 | 12/1990 |
| EP | 0456150 | 11/1991 |
| JP | 308812 | * 12/1988 |
| JP | 6419612 | 1/1989 |
| JP | 01122511 | 5/1989 |
| JP | 01122512 | 5/1989 |
| JP | 011222521 | 5/1989 |
| JP | 01176606 | 7/1989 |

OTHER PUBLICATIONS

R. Flukiger et al., "Processing of Classical and High Tc Superconducting Wires", *Applied Superconductivity*, vol. 1, Nos. 3–6, pp. 709–723.

Ullmanns Encyklopadie der technischen Chemie 4. Auflage, Band 19, pp. 385–386.

Prof. Vieweg et al., Polyacetale4, Epoxidharze, fluorhaltige Polymerisate, Silicone usw., *Kunststoff–Handbuch*, Band XI, Carol Hanser Verlag, Munchen, pp. 558–569.

Nunez–Regueliro et al., "Pressure–Induced Enhancement of Tc Above 150K in Hg–1223", *Science Magazine*, vol. 262, Oct. 1, 1993, pp. 97–99.

(List continued on next page.)

*Primary Examiner*—Christopher A. Fiorilla (57) ABSTRACT

Superconductor containing filaments having embedments of superconducting material surrounded by a rayon matrix are formed by preparing a liquid suspension which contains at least 10 weight percent superconducting material; forming a multicomponent filament having a core of the suspension and a viscose sheath which contains cellulose xanthate; and thereafter, regenerating cellulose from the cellulose xanthate to form a rayon matrix.

10 Claims, 2 Drawing Sheets

OTHER PUBLICATIONS

Amato, "High TcSuperconductors Get Squeezed", *Science Magazine*, vol. 262, Oct. 1 1993, p. 31.

Amato "Finally a Hotter Superconductor", *Science Magazine*, vol. 260, May 7, 1993, p. 755.

"Critical Temperature Nears 135K in a Mercury–Based Superconductor", *Physics Today*, Jul. 1993, pp. 20–23.

McDevitt et al., "Electrochemistry of High–Temperature Superconductors Challenges and Opportunities", *Analytical Chemistry*, vol. 65, No. 11, Jun. 1, 1993, pp. 535–545.

McWilliams, "Superconductors Run into Resistance", *Business Week*, Apr. 12, 1993, pp. 90–91.

Amato, "Theory Meets Experiment in High–T Superconductivity", *Science Magazine*, vol. 261, Jul. 16, 1993, p. 294.

Wolsky et al., "The New Superconductors: Prospects for Applications", *Scientific American*, Feb. 1989, pp. 60–69.

Chen et al., "Characteristics and Design Procedure for Hyperbolic Dies", *J. of Polymer Science: Part B: Polymer Physics*, vol. 30, 1992, pp. 557–561.

Cogswell, "Converging Flow of Polymer Melts in Extrusion Dies", *Polymer Engineering Science*, vol. 12, Jan. 1972, pp. 64–73.

Ihm et al., "A Visualization Study of Polyethylene Terephthalate Flow Using a Pseudohyperbolic Die Geometry", *J. of Polymer Science: Part B: Polymer Physics*, vol. 25, pp. 619–640 (1987).

Goto, "Critical Current Density of $Ba_2 Y_1 CU_3O_{7-x}$ Superconducting Filaments Produced by Various Suspension Spinning Conditions", *J. Materl. Res 3*, (6), Nov./Dec. 1988, pp. 1292–1296.

Zhang, "Characteristics of the Aqueous Solution of Carboxymethyl Starch Ether", *Journal of Applied Polymer Science*, vol. 46, 1992, pp. 369–374.

Dagani, "Polymer Film Effect is Basis of Molecular Switch", *C&EN*, Feb. 22, 1993, pp. 24–25.

Sudduth, "A New Method to Predict the Maximum Packing Fraction and the Viscosity of Solutions with a Size Distribution of Suspended Particles", Part 11, *Journal of Applied Polymer Science*, vol. 48, pp. 37–55.

Sudduth, A Generalized Model to Predict the Viscosity of Solutions with Suspended Particles, Part 1, *Journal of Applied Polymer Science*, vol. 48, pp. 25–36.

Kawai et al., "Higher Temperatures for Superconductors?" Report by D. P. Hamilton in *Science Scope*, vol. 256, Apr. 17, 1992, p. 299.

Cava, "Superconductors Beyond 1–2–3", *Scientific American*, Aug. 1990, pp. 42–49.

Miyashiro, *Hybrid Circuits No. 19*, May 1989, pp. 19–22.

Wu et al., "Superconductivity at 93K in a New Mixed Phase Y–Ba–Cu–O Compound System at Ambient Pressure", *Physical Review Letters*, vol. 58, 1987, pp. 908–910.

Buhler, *Kollidon Polyvinylpyrrolidone for the pharmaceutical industry*, BASF Product Information, Aug. 1993, 2nd edition, pp. 116, 120, 175–182.

Barten, H. et al., "Inventory of Possible Electrical–Power Applications of High–Tc Superconductors", *Kema Scientific and Technical Reports*, vol. 7, 1989, pp. 201–226.

Wizon and Robertson, "Continuous Filament Ceramic Fibers via the Viscose Process", *Journal of Polymer Science: Part C, No. 19*, pp. 267–281.

Cass, R.B., "Fabrication of Continous Ceramic Fiber by the Viscous Suspension Spinning Process", *Ceramic Bulletin*, vol. 70, No. 3, 1991, pp. 424–429.

Catania, Hovnanian, Cot, "Superconducting $YBA_2Cu_3O_{7-x}$ Fibers from Aqueous Acetate/PAA and Nitrate/PAA Gels", *Mat. Res. Bull.*, vol. 25, 1990, pp. 1477–1485.

Goto, Sugishita and Kojima, "A New Fabrication Process of $Y_1Ba_2Cu_4O_8$ Superconducting Filament by Solution Spinning Method Under Ambient Pressure", *Physica*, C171, 1990, p. 441–443.

Goto, "Nonaqueous Suspension Spinning of High–Tc Ba–Y–Cu–O Superconductor", *Japanese Journal of Applied Physics*, vol. 27, No. 4, Apr. 1988, pp. L680–L682.

News Realease, "Argonne and BASF Improving Superconducting Wire", Argonne, Illinois, Oct. 20, 1992.

Adrian, Cowan, "The New Superconductors", *C&EN*, Dec. 21, 1992, pp. 24–41.

Taubes, "Holding the Lines in High–Temperature Superconductors", *Science*, vol. 261, Sep. 17, 1993, pp. 1521–1522.

Goto, "Fine Y–Ba–Cu–O Superconducting Filaments Produced by Suspension Spinning Method", *Physica C*, 1989, pp. 558–559.

Billmeyer, Jr., "Regenerated Cellulose", *Textbook of Polymer Science*, 2nd ed., 1971, pp. 445–447.

Ginley, Venturini, Kwak, Mitchell, Morosin, Baughman, "Rapid Thermal Processing of $YBa_2Cu_3O_7$ Spun Wires", *J. Appl. Phys* 67, May 15, 1990, pp. 6382–6388.

Japan New Materials Report, Sep.–Oct. 1993, pp. 9–12.

* cited by examiner

PROCESS FOR THE PRODUCTION OF SUPERCONDUCTOR CONTAINING FILAMENTS

GOVERNMENT LICENSE RIGHTS

This invention was made with Government support under a Collaborative Research and Develoment Agreement between Argonne National Laboratory and BASF Corporation (ANL Prime Contract No. W-31-109-ENG-38 under Subcontract No. ANL-85703) awarded by the Department of Energy. The Government has certain rights in this invention.

FIELD OF THE INVENTION

The present invention relates generally to superconductor containing filaments and processes for preparing them. More particularly, the present invention relates to superconductor containing filaments prepared from multicomponent filaments and processes for preparation of the same.

BACKGROUND OF THE INVENTION

As used herein, the term "green" refers to material that has not been through a heat treatment during which organic polymeric materials are combusted.

The terms "filament" or "filaments" refer to fibers of long or indefinite length.

The term "multicomponent filament" refers to filaments having two or more longitudinally continuous distinct domains of constituents.

The terms "ceramic" or "ceramics" refer to inorganic, nonmetallic solids that are subjected to high temperature, generally greater than 600° C., during manufacture or use or both.

The terms "superconductor" or "superconductors" refer to materials that will conduct electricity with no loss of energy due to resistance below a certain critical transition temperature (Tc), below a certain critical current (Jc) and in a magnetic field below a critical strength (Hc). These materials show the Meissner effect (the repulsion of magnetic fields independent of field polarity) below the critical transition temperature (Tc) and critical magnetic field strength (Hc). The critical field strength (Hc) is a function of the temperature. Field strength values are higher at lower temperatures. "High temperature superconductors" are those which have a superconducting transition temperature (Tc) above 77K (boiling point of nitrogen under atmospheric pressure).

The term "viscose" refers to a viscous solution containing dissolved cellulose xanthate such as is used for spinning into rayon.

The term "rayon" refers to a semisynthetic fibrous material spun from viscose and composed of regenerated cellulose.

The terms "precursor" or "precursors" refer to starting or intermediate materials in the fabrication of the superconducting materials that have not yet been processed into a crystalline or semi-crystalline solid capable of superconduction. Metal oxide superconductor precursors are stoichiometric mixtures of nonsuperconducting oxides, nitrates, acetates, carbonates, or other chemical derivatives of potentially superconducting materials that are to be fired or sintered into the superconducting alloy. During firing or sintering, the undesired elements are driven off leaving a superconducting residue.

The discovery of high temperature superconductors opened the pathway for several applications (e.g., supermagnets, generators, electrical energy storage). There are, however, many issues that need to be resolved prior to commercial use of the high temperature superconductors. For example, it is believed that, unlike malleable metals, high temperature superconducting materials cannot be processed by first melting and then forming them to the desired shape, for example, wires. One important field of investigation is, therefore, how to produce superconducting wires having sufficient current density and which are sufficiently insensitive to magnetic fields.

Early work along these lines involved mixing a slurry of a superconducting material into a fiber forming material, and spinning the mixture to form fibers. Fibers made by this process generally lack good fiber properties since high loading of superconducting material into the fiber forming material deteriorates spinning performance. As a result, insufficient superconductor loading resulted in poor superconducting performance, e.g., insufficient consolidation of the superconducting particles. R. B. Cass, "Fabrication of Continuous Ceramic Fiber by the Viscous Suspension Spinning Process", *Ceramic Bulletin, Vol.* 70, No. 3, 1991 describes the loading of viscose with superconducting material which is then spun.

Oxide ceramic superconducting fibers are described in Japanese Kokai Tokkyo Koho Nos. 01,122,511; 01,122,512; and 01,122,521. The fibers may be made by dispersing the superconductor or its source material in an aqueous solution of a water soluble polymer like polyvinyl alcohol; wet spinning the aqueous solution into a solution which precipitates the polymer; and heating the fibers.

Superconducting fibers based on oxide superconductors and products resulting therefrom may be prepared by extruding the superconductor in a binder. Brazilian Patent Application No. 87 03,412 discloses ceramic oxide powder in a polymer binder. The polymer is removed by heating at 100° C. and the superconductor is sintered. Japanese Kokai Tokkyo Koho No. 01,176,606 describes a process for making oxide superconducting fiber precursors by dispersing or dissolving an oxide superconductor source material in a solution containing a polymer. The polymer is then spun to form a precursor fiber which is heated. The polymer may be polyvinyl alcohol.

Ceramic superconducting fibers have been spun using nitrate and acetate superconducting precursors in polyacrylic acid gels. Catania, Hovnanian, Cot, "Superconducting $YBa_2Cu_3O_{7-x}$ Fibers From Aqueous Acetate/PAA and Nitrate/PAA Gels", *Mat. Res. Bull.*, Vol. 25, 1990, pp. 1477–1485, describe a lengthwise orientation of the fiber particles. The resulting fibers are described as having poor mechanical properties.

Goto, Sugishita and Kojima, "A New Fabrication Process of $Y_1Ba_2Cu_4O_8$ Superconducting Filament by Solution Spinning Method Under Ambient Pressure", *Physica*, C 171, 1990, pp. 441–443 describe the preparation of ceramic superconducting fibers by dry spinning superconducting precursors (yttrium, barium and copper acetates) in a polyvinyl alcohol carrier under one atmosphere oxygen pressure. The resulting fiber was considerably porous.

Goto, "Nonaqueous Suspension Spinning of High-$T_c$Ba—Y—Cu—O Superconductor", *Japanese Journal of Applied Physics*, Vol. 27, No. 4, April, 1988, pp. L680–L682 discusses the nonaqueous suspension spinning of a superconducting ceramic oxide filament by suspending a fine powder of the oxide precursors in polyvinyl alcohol dimethyl sulfoxide solution containing a dispersant. The suspension is extruded into a precipitating medium of methyl alcohol and coiled on a winding drum. The wound filament is dried and subjected to heat treatment to generate the superconductor.

European Patent Application Publication No. 0 248 432 discloses a process for making a ceramic green body (which may be a fiber) including contacting a superconductor precursor material slurry with a solidifying liquid. The slurry contains a ceramic powder raw material, a binder and a solvent. The binder may be nitrocellulose or cellulose acetate.

It is known to make ceramic fibers from ceramic precursor sheath/core fibers. U.S. Pat. No. 4,863,799 to Mininni et al. describes a preceramic fiber made by melt or solution spinning a sheath/core fiber in which the preceramic material forms the core. Organosilicone preceramic polymers are spun as a core and certain film forming polymers are used for spinning a sheath layer. Cellulose esters of carboxylic acids, such as cellulose acetate, cellulose propionate, cellulose acetate propionate, and the like, may be used as the sheath.

U.S. Pat. No. 4,559,191 to Arons describes another process for preparing a green ceramic fiber using a sheath/core spinning technique. A green ceramic powder is formed into a dispersion or slurry and placed in the core. Suitable sheath forming polymers include cellulosic esters, among others. When the fiber is wet spun, it is extruded into a coagulation bath. The coagulation bath is any nonsolvent for the sheath forming polymer including water, methanol, propanol, ethylene glycol and the like.

It is also known to make bicomponent cellulosic fibers. Viscose rayon bicomponent fibers are described in U.S. Pat. No. 2,428,046 to Sisson et al.

There remains a need for a green filament which has superconducting particles at a density and aligned properly to give a usefully high current density and yet still remains manageable, e.g., non-friable.

Also, precursors to superconducting materials typically require special handling techniques to avoid contamination that may hinder superconductivity. Furthermore, most metal oxide superconducting materials are anisotropic with regard to electrical conductivity, i.e., they conduct only in a particular spacial orientation. The particles should all be aligned in this direction to optimize the critical current density. The firing of green wires or filaments containing precursors does not allow for the alignment of the superconducting particles.

SUMMARY OF THE INVENTION

One embodiment of the present invention is a process for the production of superconductor containing filaments. The process involves preparing a liquid suspension which contains at least 10 weight percent superconducting material; forming a multicomponent filament having a core of the suspension and a viscose sheath which contains cellulose xanthate; and thereafter, regenerating cellulose from the cellulose xanthate to form a rayon matrix.

In another embodiment, the present invention involves a filament containing superconductor which is a multicomponent filament including one or more embedments of a superconductor material and longitudinally coextensive therewith a rayon matrix surrounding each embedment.

It is an object of the present invention to provide a process for making filaments of superconducting material.

Another object of the present invention is to provide filaments of superconducting material.

Related objects and advantages will be apparent to those of ordinary skill in the art after reading the following detailed description.

DESCRIPTION OF THE PREFERRED EMBODIMENTS

To promote an understanding of the principles of the present invention, descriptions of specific embodiments of the invention follow, and specific language describes the same. It will nevertheless be understood that no limitation of the scope of the invention is thereby intended, and that such alterations and further modifications, and such further applications of the principles of the invention as discussed are contemplated, as would normally occur to one ordinarily skilled in the art to which the invention pertains.

In a first embodiment, the present invention involves a process for producing filaments containing superconductor. In this process, a multicomponent filament having a viscose matrix containing one or more embedments of superconductor in the form of a suspension is formed. After formation, cellulose is regenerated from the cellulose xanthate of the viscose to form rayon. In this form, the superconductor/rayon filament may be shaped to a predetermined form and then fired to burn off the rayon and other non-superconducting materials.

The preparation of a multicomponent filament structure provides several advantages over a monocomponent superconductor filament. The use of a multicomponent filament structure allows for bending and shaping without the cracking and breaking that occurs in an equivalent weight of monocomponent filaments. The matrix binds the superconductor material into the proper filamentary geometry and allows the superconductor to be shaped into a desired form, e.g., a coil. The matrix/embedment structure allows high superconductor loading in the embedments while permitting smooth flow in the spinning capillaries because of the polymeric matrix. The use of a rayon matrix is advantageous since rayon does not melt and it leaves little residue on burning. Additionally, regenerating cellulose xanthate into rayon compacts the core, thus leading to more tightly packed superconductor particles. The end result of such packing is a denser superconducting filament.

Several cross sections of the filament are possible. It may be, for example, round or multilobal. The matrix embedment characteristic may be a sheath/core, islands-in-the-sea or other similar structure so long as the rayon matrix surrounds the superconducting embedments.

The resulting green fiber is flexible and can be formed into the desired form. The bending radius of the green filament is less than 1 inch. The fiber has a sufficient tensile strength to allow the optional forming.

Also, it is advantageous to use several filaments to form a multifilament wire or to make a green filament having several embedments. The multifilament structure allows individual filaments to independently move to accommodate stresses from the manipulation of either the green or the fired fiber.

In the end, the filaments containing superconducting material formed by the present invention preferably have a current density of at least 1000 amps/$cm^2$ at (Tc-10)K.

The Suspension Containing Superconductor

The suspension containing superconductor must be spinnable and also must be compatible with the viscose matrix of the fiber. It is preferable that the superconducting material be placed in a suspension. The suspension should have adequate viscosity, pH, and surface tension. It should be stable to settling and agglomeration for a reasonable length of time to permit its use in filament forming. In general, there are four elements of the suspension which have been identified for use in the present invention. These four elements are the carrier liquid, the superconductor, the thickener and the dispersant. However, these four elements should not be considered limiting and other elements may be used or added as will be readily understood by those who are ordinarily skilled in the art. Additionally, some ingredients may serve two functions; for example, as both a carrier liquid and a dispersant. The suspension preferably has a pH greater than or equal to about 10; viscosity greater than 3,000 mPa·sec at 120 (1/min) shear rate; good visual uniformity, stability for more than about 4 hours; and no bubbles. One manner of removing bubbles is to allow the suspension to stand for several hours to allow the bubbles to rise. Alternatively, a vacuum may be applied to speed bubble removal. Other methods may also be used in accordance with the knowledge of those who are ordinarily skilled.

The uniformity and stability of a suspension is dependent on several parameters. Sedimentation velocity has a significant affect on the stability of a suspension.

Another phenomenon bearing consideration is the agglomeration of the particles in the suspension. Agglomerates may plug (either partially or totally) one or more spinneret holes, thereby decreasing the processability of the fiber and the effective process run time. The superconducting particles should be uniformly distributed throughout the suspension. Agglomeration may be inhibited by decreasing the attractive forces among the superconducting particles.

Even though particle agglomeration is undesired, if the repulsion of the particles is too high, suspension viscosity may be insufficient. Sufficiently high viscosity enhances a low sedimentation rate. The viscosity of a suspension is dependent on various parameters. The viscosity is generally dependent on the following parameters: pressure; temperature; shear rate (for non-Newtonian fluids); solid content (concentration); and time (flocculation, slow reaction). The effect of pressure can generally be neglected because of the low pressure gradients present.

The suspension should be compatible with the matrix material. Even if the contact time of the viscose component and the superconducting suspension in the spinneret capillary is very short, it is still long enough to result in deterioration of the spinning performance or even to stop the flow through the capillary if the appropriate conditions are not maintained. The chemical stability of viscose is sensitive to even slight reductions in pH. The most preferred pH for viscose spinning is approximately 13. If the suspension has a pH that is too low, a decrease in the viscose pH can be caused at the interface of the components. Therefore, the suspension is preferably kept at a pH of at least about 10 and, more preferably, about 13.

The viscosity of the suspension must be such that spinning is practical. Presently, the preferred viscosity limits are 3000–8000 mPa·sec but the preferred viscosity could vary based on process improvements.

The suspension containing superconductive powder is made in several steps and involves several substances as described. Although a variety of methods may be used to make a suitable suspension, one is particularly preferred: First, the dispersant is mixed into the carrier liquid. Then a thickener is added to the mixture. The thickener should be completely dissolved. Complete dissolution may be achieved by heating a portion of the carrier liquid sufficiently to enhance dissolution before the addition of the thickener but it is not essential to heat the carrier liquid. The remainder of the carrier liquid is added after the thickened portion has cooled down to room temperature. The viscosity, pH and surface tension of this liquid should be maintained within predetermined limits that vary according to the materials used. Exemplary ranges for various solutions are found in the examples. Ranges for other combinations of ingredients are readily determinable according to the materials and superconductor used. Finally, the superconductor is added. Advantageously, the suspension is maintained in a sealed environment at all times to prevent evaporation.

The Superconductor

A large variety of superconducting materials is useful in the present invention. The superconductor may be ceramic or non-ceramic. Exemplary ceramic superconductors include $(LaBa)_2 CuO_4$, $YBa_2Cu_3O_7$, $Tl_2Ba_2Ca_2Cu_3O_{10}$, $Bi_2Sr_2CaCu_2O_8$, $La_{1.85}Sr_{0.15}CuO_4$, $HgBa_2Ca_2Cu_3O_8$, $HgBa_2CuO_4$, $B_{1.8}Pb_{0.4}Sr_{2.0}Ca_{2.2}Cu_{3.0}O_{10.6}$, and doped fullerenes as well as many other ceramic superconductors. Those ordinarily skilled in the art will readily understand that the oxygen stoichiometry given is only approximate and actual amounts of oxygen in these compounds is typically slightly less than indicated. Exemplary non-ceramic superconductors include $NbC$, $V_3Si$, $Nb_3Gr$, $Nb_3AL_{0.75}Gr_{0.25}Nb_3S_n$, NbTi alloys, NbTiZr alloys, NBTiTa alloys, $V_3Ga$, lead and mercury. Presently, the preferred superconductor is yttrium-barium-copper-oxide ($YBa_2Cu_3O_{7-x}$) wherein x is less than 0.4 and, more preferably, less than 0.1.

Preferably, the superconductor is loaded into the suspension at as high an amount as practical based on the weight percent of the suspension. Superconductor loading is preferably at least about 20 weight percent of the suspension. The presently most preferred loading is at least 60 weight percent. Even higher loading (up to about 85 weight percent or more) is possible.

The crystal structure of the superconducting powder may be a factor in obtaining a suitable dispersion. Preferably, the $YBa_2Cu_3O_{7-x}$ powder is a single crystal variety but the preferable form may depend on the superconductor used. If the particles are too large for spinning, they may be milled using a ball mill or other suitable mill and milling may be optionally followed by filtering through a screen to remove large particles. In general, the average particle size is preferably about 5 microns and, more preferably, 2–4 microns. Of course, the size may vary according to the size of the spinning orifice or the intended end use.

Large aspect ratios are preferred since they favor alignment of the particles in the superconducting direction during spinning. Currently, the most preferable aspect ratio is at least 1.5.

The Thickener

A variety of thickeners can be used in forming the core suspension. The thickener should burn out or melt with the rayon leaving as little residue as possible. The thickener should be used in a quantity sufficient to achieve a suspension viscosity of 3000–8000 mPa·sec. This depends on the particular thickener used and other substances involved.

Suitable thickeners include certain viscosity modifiers based on methylcellulose such as those in the Methocel® line, for example, Methocel® 20–213 (97% hydroxypropylmethyl cellulose polymer (CAS #009004-65-3), Dow Chemical Co.). Other suitable thickeners include polyethyleneoxide (high molecular weight); polyacrylamide; and polyvinylpyrrolidone. These are exemplary only. A large variety of thickeners may be used.

Polyacrylamide (molecular weight 5–6 million) is another useful thickener for the superconductor suspension. This polymer is soluble in water and some polar organic solvents and relatively insensitive to changes in pH. It can be synthesized to high molecular weights and the long, more ordered, polymeric chain may be beneficial for the end superconductivity. If polyacrylamide is used, the presently preferred amount of polyacrylamide in suspension is 4 weight percent based on total suspension weight.

The presently preferred thickener is polyethyleneoxide. When the molecular weight is about 5,000,000, then preferably 2 weight percent polyethyleneoxide is used. Of course, when lower molecular weight polyethyleneoxide is used, more should be added to attain the target viscosity. Polyethyleneoxide is preferably used with formamide as a carrier liquid.

Carrier Liquid

An aqueous electrolyte is beneficial as the carrier liquid. Advantageously, the carrier will evaporate during burn off of the rayon sheath or will be washed away during the regeneration step. Suitable electrolyte solutions include Isoton® II sold by Coulter Diagnostics, Hialeah, Fla. (NaCl 7.93 g/L; Disodium EDTA 0.38 g/L; KCL 0.40 g/L; $NaH_2PO_4$ 0.19 g/L; $NA_2HPO_4$ 1.95 g/L, NaF 0.3 g/L) and many other salt solutions.

Organic liquids may also be used as the carrier liquid. Propylene carbonate, dimethylsulfoxide, dimethylformamide and formamide are exemplary useful organic liquids.

Depending on which carrier liquid is used, the superconducting powder is added before or after heating. The choice of thickener also affects whether or not heating is necessary. The time of addition can greatly affect the uniformity of the suspension. For example, for Isoton® II, the superconducting powder is preferably added before heating when Methocel® 20–213 is the thickener.

Dispersant

A dispersant decreases attraction between the superconductor particles. Suitable dispersants include lower aliphatic alcohols like 2-propanol, inorganic electrolytes and surfactants. 2-propanol is especially useful when polyacrylamide is the thickener.

In some cases, the carrier liquid may also act as dispersant and so additional dispersing agents are not necessary. An amount of dispersant suitable to prevent agglomeration without desolubilizing the thickener should be used (2–8 vol percent of 2-propanol is presently preferred).

Matrix Preparation

The matrix material may be prepared according to well known techniques. The useful spinning techniques are also those well known in the art for spinning rayon with modifications for the suspension. For example, the spin bath constituents, the residence time of the suspension, etc., may be modified as necessary to achieve satisfactory spinning performance. The rayon process consists mainly of pulp (raw material) conversion to viscose, viscose filtration, spinning (including conversion to rayon in the spin bath), and stretching. Finally, washing and any desired fiber after treatments occur. In the practice of the present invention, the viscose was taken after the second filtration step (after approximately eight hours of maturity). In preparing the viscose, metals which are incompatible with superconducting properties should be avoided. Preferably, the viscosities of the viscose and the suspension will be of the same order of magnitude to promote spinning compatibility.

Spinning the Filaments

The spinning process is substantially that used to wet spin viscose into rayon. The following description of a spinning process is exemplary only and modifications, alterations and substitutions are intended to be encompassed and will be understood by those of ordinary skill in the art.

The capillary shape is preferably modified to enhance particle alignment in the spun fiber. It is advantageous and allows for fine deniers if the spinneret is completely submerged in the regeneration bath. The spinning equipment was designed to:

1) minimize the volume in the equipment, and thus the amount of superconductor used;
2) allow higher pressure drops, possibly created by the long spin plate capillary;
3) and be compatible with the acid regeneration bath.

Figure 1:
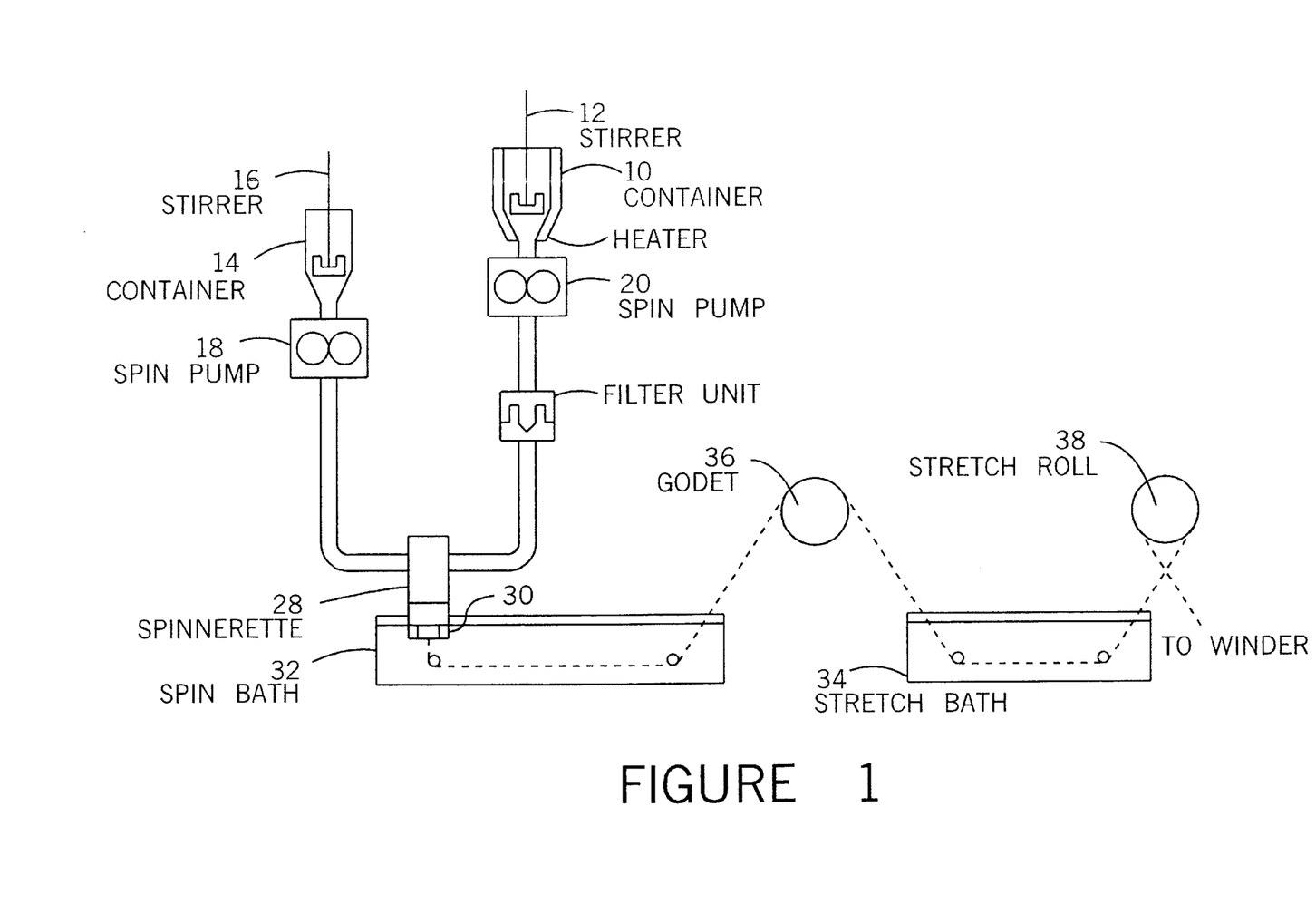
FIG. 1 is a schematic illustration of a multicomponent spinning process useful for the present invention.

The design of the superconductive fiber process is depicted in FIG. 1. The superconducting suspension is placed into an optionally temperature controlled feed container 10 which is agitated by stirrer 12. Some substances may require an elevated temperature to control viscosity and prevent precipitation. The viscose is placed into the second container 14 and may be stirred with stirrer 16 if necessary to keep the viscose homogeneous. Both containers may be pressurized up to 25 psi to increase the inlet pressure of spin pumps 18 and 20 and avoid poor feeding (starving of the pumps). After the start-up of spin pumps 18 and 20, the multicomponent fiber is formed in spin pack 28. Any conventional multicomponent spin pack may be used but those described in U.S. Pat. No. 5,162,074, incorporated herein by reference, are presently preferred. Spinneret 30 is submerged into spin bath 32 to reduce the regeneration time of viscose to rayon, and thereby, to improve the fiber stability and reduce die swell. The spin bath (regeneration bath) composition is 17 weight percent $H_2SO_4$, 20 weight percent $Na_2SO_4$, and 0.2 weight percent $ZnSO_4$. The fiber is stretched in both spin bath and subsequent stretching bath 34 between godets 36 and 38. The stretching bath composition is 4.0 weight percent $H_2SO_4$, 7.0 weight percent $Na_2SO_4$, 0.3 weight percent $ZnSO_4$.

Both the viscose and the suspension streams may be filtered using, for example, sintered metal candle filters located in the spin pack. For viscose, approximately 60 micron filtration appears sufficient. The suspension should be filtered. Optimum filtration depends on several parameters, such as raw materials used, suspension preparation procedure and stability of the suspension.

Finally, the fiber is collected on a winder (diameter 15 cm). The fiber can then be cut, washed, dried and tested with regard to various properties, such as mechanical properties, density, superconductor distribution, etc. It is also possible to investigate the quality and the properties of the fiber in subsequent after-treatment processes (such as heating) without cutting the fiber. The green fiber is then ready for firing.

Particle Alignment

Figure 2:
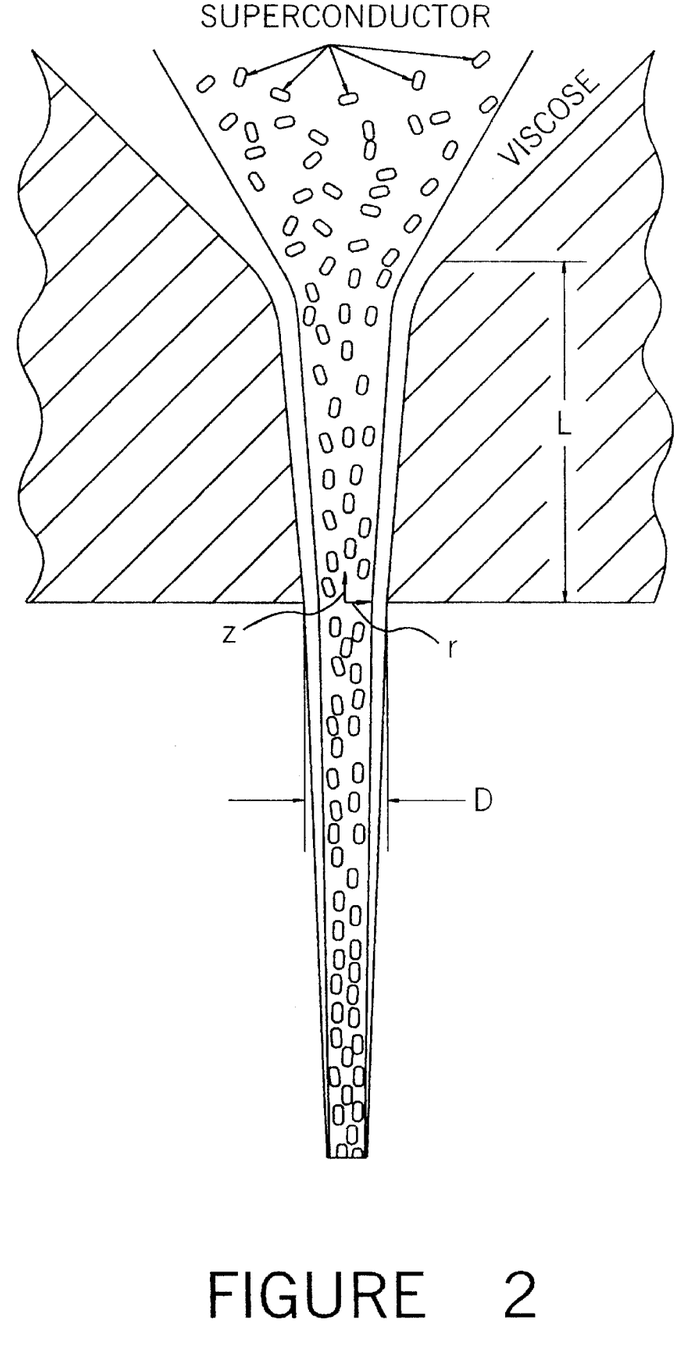
FIG. 2 is a cross-sectional schematic illustration of a spinneret capillary designed to align particles passing through it.

Certain types of superconducting particles are anisotropic in regard to electrical conductivity. $YBa_2Cu_3O_7$ is one such superconductor. This means that particles with length to diameter ratios above 1 along the correct axis can be aligned to improve the current density. The first alignment may occur during the spinning. It is possible to start the alignment of the particles in the spinneret capillary and continue the alignment during the primary stretching. FIG. 2 schematically illustrates a shape of the capillary useful to align particles extruded.

Additional alignment of the particles can be achieved during secondary stretching in the stretch bath. Further alignment is possible by introducing a relatively high magnetic field after spinning. Magnetic fields in the order of magnitude of 10 to 100 kilogauss align the particles.

Because of the anisotropic character of the particles, no aspect ratio is needed to do so. The magnetic alignment can be performed in-line or shortly after spinning. In order to minimize alignment resistance, the viscosity of the core component should not be allowed to increase excessively. The viscosity of the core component depends on the carrier liquid concentration. A part of the carrier liquid diffuses through the rayon sheath into the spin bath. The resistance of the sheath (conversion of the viscose to rayon) can be controlled by adjusting the bath constituents and the bath temperature.

Flow in the Spinneret Capillary

Alignment in the spinneret capillary depends on the capillary geometry and the resulting flow profiles. The capillary shape should be hyperbolic. The optimum shape may be determined as follows. Flow can be regarded as a two-dimensional flow. The corresponding cylinder coordinates (r, z) are depicted in FIG. 2. The velocity profile v–v(r,z) can be derived using the Navier-Stokes equation. After several simplifying assumptions, the equation balances pressure drop and flow resistance. Because of space constraints, the derivation of the equation and the assumptions made are not presented here. The maximum velocity gradient in the z direction is:

$$(\partial v/\partial z)_{max} = \frac{\tan\theta}{2} \frac{3n+1}{n+1} \frac{4Q}{\pi r^3}$$

| $\partial v/\partial z$ strain rate (velocity gradient in z direction) | |
|---|---|
| v | velocity |
| θ | angle between the vertical and the capillary wall |
| n | power law coefficient |
| τ | shear stress |
| s | apparent shear rate (s = 4Q/(π r$^3$) |
| Q | volume flow rate |
| R | radius of capillary at exit (z = 0) |

If this maximum strain rate is constant, it is independent of the coordinate z. That case can be regarded as an important factor in retaining flow-induced orientation. The power law coefficient was determined by using viscosity data measured. Those calculations resulted in a coefficient of approximately 0.5. By defining expressions in the equation above, a simpler form can be achieved.

$$N = (3n+1)/(2(n+1)) \qquad K = (dv/dz)_{max}$$
$$A = K\pi/(2QN) = -2\tan\theta_o/R^3 \qquad r = (Az + R^{-2})^{1/2}$$

Assuming that the angle at the maximum radius (z=L) is 45°, the equation yields:

$$L=((-A/2)^{2/3}-R^{-2})/A$$

FIG. 2 shows the capillary length "L" and capillary diameter "D".

Firing

For $YBa_2Cu_3O_{7-x}$ type superconductors, firing temperatures of 900–1000° C. in an oxygen-rich atmosphere promote the superconductor phase formation. This firing may be done in an oxygen-rich environment to facilitate the combustion and restore the stoichiometry of the superconducting phase of the materials. Other superconductors may require environments specially tailored to optimize superconducting properties.

In a modification of the first embodiment, this invention involves loading the sheath with a thermally and electrically conductive element such as copper, platinum, silver or gold. After firing, the metallic element forms a thermally and electrically conductive sheath that protects the wire or filament from environmental conditions. For example, a superconductor may become too warm or be operated in a high magnetic field. The metal will conduct heat away and form a path for the electric current unable to pass through the superconductor at the elevated temperature.

Platinum is preferable because it resists oxidation. The metal may be loaded in the sheath at about 10% relative to the weight of the superconductor.

Another embodiment of the present invention is a filament which contains superconductor which may be prepared according to the above process. This filament is characterized by a core containing a very high loading of superconductor (>90 weight percent) in green state and high density of the superconducting particles due to the regenerating viscose applying pressure to the core driving the carrier liquid out without leaving voids behind.

In the modification of the first embodiment, treatments to improve the resistance of the filament which contains superconductor to magnetic fields is done (flux pinning). One method for this is to place the fiber in the beam path of a heavy ion accelerator. Another method is to include an element that is readily fissionable in the superconductor suspension. The preferred element would be the 235 molecular weight isotope of uranium. In this second method, the fiber may then be exposed to a thermal neutron source which will induce fission in many of the uranium atoms. Other methods include the creation of defects through an oversupply of yttrium in making the original superconducting powder or inducing defects which may pin the magnetic flux by, for example, subjecting the superconducting powder to high pressures.

The invention will be described by reference to the following detailed examples. The examples are set forth by way of illustration, and are not intended to limit the scope of the invention. In the following examples, the following instruments are used to make the measurements:

TABLE 1

| Measurement | Instrument |
|---|---|
| ph | Accumet pH meter 910 from Fisher Scientific with an Ag/AgCl 91–96 orion probe |
| surface tension | Tensiomat Model 21 from Fisher Scientific |
| viscosity | Brookfield Concentric Viscometer, Model VT from Brookfield Engineering Laboratories, Inc. |

All percents are percents by weight unless otherwise specified.

EXAMPLE 1

Preparation and Characterization of Polyacrylamide Solutions in Isoton®II

A 4 weight percent polyacrylamide ("PAA") solution (5,000,000 to 6,000,000 molecular weight from Polyscience Inc.) is made by weighing 4 grams of PAA for every 100 grams of carrier liquid used. Isoton®II (carrier liquid) is agitated using a magnetic stirrer at medium speed. The PAA is slowly added to the Isoton®II with continued stirring for approximately 40 minutes after the addition of PAA. The stirring speed is adjusted to compensate for the increased viscosity of the solution. The solution is usually allowed to stand overnight so that air bubbles have sufficient time to dissipate. Once the solution is homogeneous and bubble free, the properties of the solution (pH, viscosity and surface tension) are measured to ensure that they are within the following ranges:

| | |
|---|---|
| Viscosity | : 3,000 to 8,000 mPa · sec at 120/min shear rate |
| pH | : 6.5–8.0 |
| Surface tension | : <80 dyn/cm (most preferably 50 dyn/cm) |

The actual measurements are as follows:

| | | |
|---|---|---|
| Viscosity | : | 4,700 mPa · sec |
| pH | : | 6.8 |
| Surface tension | : | 74 dyn/cm |

EXAMPLE 2

Preparation and Characterization of Polyethyleneoxide Solutions in Isoton®II

A 2.5 weight percent polyethyleneoxide ("PEO") solution (5,000,000 molecular weight from Polyscience Inc.) is made by weighing 2.5 grams of PEO for every 100 grams of carrier liquid used. 92 grams of Isoton®II (carrier liquid) and 8 grams of 2-propanol are added per 100 grams of liquid mixture. PEO is slowly added to the liquid mixture while mixing with the dispersator at a low speed until completely dissolved in Isoton®II. The stirring speed is adjusted to compensate for the increased viscosity of the solution. When flow properties of the solution make mixing difficult, the solution is allowed to stand for 30–45 minutes, and then mixed another 3 minutes. The solution is usually allowed to stand overnight so that air bubbles have sufficient time to dissipate. Once the solution is homogeneous and bubble free, the properties of the solution (pH, viscosity and surface tension) are measured to ensure that they are within the following ranges:

| | |
|---|---|
| Viscosity | : 3,000 to 8,000 mPa · sec at 120/min shear rate |
| pH | : 6.5–8.0 |
| Surface tension | : <80 dyn/cm (most preferably 50 dyn/cm) |

The actual measurements are as follows:

| | | |
|---|---|---|
| Viscosity | : | 4,300 mPa · sec |
| pH | : | 7.8 |
| Surface tension | : | 69 dyn/cm |

EXAMPLE 3

Preparation and Characterization of Polyethyleneoxide Solutions in Formamide

A 2 weight percent polyethyleneoxide ("PEO") solution (5,000,000 molecular weight from Polyscience Inc.) is made by weighing 2 grams of PEO for every 100 grams of formamide (carrier liquid) used. PEO is slowly added while mixing with the dispersator at a low speed until completely dissolved in formamide. The stirring speed is adjusted to compensate for the increased viscosity of the solution. When flow properties of the solution make mixing difficult, the solution is allowed to stand for 30–45 minutes, and then mixed another 3 minutes. The solution is usually allowed to stand overnight so that air bubbles have sufficient time to dissipate. Once the solution is homogeneous and bubble free, the properties of the solution (pH, viscosity and surface tension) are measured to ensure that they are within the following ranges:

| | |
|---|---|
| Viscosity | : 3,000 to 8,000 mPa · sec at 120/min shear rate |
| pH | : 6.5–10.0 |
| Surface tension | : <80 dyn/cm (most preferably 50 dyn/cm) |

The actual measurements are as follows:

| | | |
|---|---|---|
| Viscosity | : | 6,100 mPa · sec |
| pH | : | 9.5 |
| Surface tension | : | 68 dyn/cm |

EXAMPLE 4

Preparation and Characterization of Polyvinylpyrrolidone Solutions in Ethyl Alcohol A solution of polyvinylpyrrolidone ("PVP") is made by adding 20 grams of PVP obtained from Polyscience, Inc., for every 100 grams of solvent. The PVP molecular weight is approximately 1,000,000. 300 grams of ethyl alcohol (per 60 grams PVP) is weighed into a 600 ml beaker. PVP is added to the ethyl alcohol with very slow mixing with a dispersator. The solution is allowed to stand tightly covered for approximately 1 hour then stirred again and allowed to stand overnight so that the air bubbles have sufficient time to dissipate. Once the solution is homogeneous and bubble free, the properties of the solution (pH, viscosity and surface tension) are measured to ensure that they are within the following ranges:

The preferred range of those parameters are:

| | |
|---|---|
| Viscosity: | 1,500 to 5,000 mPa · sec at 120 min/shear rate |
| pH: | 6.5–8.0 |
| Surface tension: | <40 dyn/cm |

The actual measurements are:

| | |
|---|---|
| Viscosity: | 2,000 mPa · sec |
| pH: | 7.2 |
| Surface tension: | 31 dyn/cm |

EXAMPLES 5–8

Preparation and Characterization of Suspensions Containing Superconductor

Screened $YBa_2Cu_3O_{7-x}$ (from SSC, Inc.) is added in small increments to 300 grams of a solution made according to Examples 1–4 to make suspensions of superconductor as shown in the following table. The suspension is stirred for 30 seconds after each addition of superconductor using a dispersator at a low speed. The stirring speed is adjusted to compensate for the increased viscosity of the suspension. Stirring time does not exceed 15 minutes. The suspension is usually allowed to stand overnight so that air bubbles have sufficient time to dissipate. Once the suspension is homogeneous and bubble free, the properties of the suspension (pH, viscosity and surface tension) are measured to ensure that they are within the following preferred ranges:

| | |
|---|---|
| Viscosity: | 5,000 to 9,000 mPa · sec at 120 /min shear rate |
| pH: | 10–13.5 |
| Surface tension: | <80 dyn/cm (most preferably 50 dyn/cm) |

The properties of these suspensions are reported in Table 2.

TABLE 2

| Example | Solution | Superconductor Content (wt %) | Viscosity (mPa · sec) | pH | Surface tension (dyn/cm) | Stability* |
|---|---|---|---|---|---|---|
| 5 | 1 | 50 | 6,600 | 11.0 | 77 | 5 |
| 6 | 2 | 40 | 4,100 | 12.2 | 68 | 4 |
| 7 | 3 | 60 | 7,800 | 11.0 | 71 | >170 |
| 8 | 4 | 60 | 8,000 | 12.0 | 36 | >48 |

*by continuous measurement of viscosity, pH, surface tension. A change of 25% in any parameter is considered an indicator of instability.

EXAMPLE 9

Spinning of Bicomponent Filaments

A circulating acid bath contains 18 weight percent sulfuric acid, 0.3 weight percent zinc sulfate, 21 weight percent sodium sulfate and 30 PPM lauryl pyridium chloride. A stretch bath contains 4 weight percent sulfuric acid, 0.3 weight percent zinc sulfate and 7 weight percent sodium sulfate. The circulating bath is heated to 45° C. and the stretch bath is heated to 95° C. A viscose container and a container of superconducting suspension prepared according to Example 3 are pressurized with nitrogen to 20 psig. When the lines are completely filled, they are attached to the spin pack and allow the components to flow out of the spinneret hole. A true bicomponent flow is established in the spinneret capillary at 40 RPM and then reduced to 9 RPM for the suspension and 18 RPM for the viscose. A spin godet is run at 24 RPM. The first stretch roll is run at 30 RPM. The second stretch roll is run at 45 RPM and the winder is run at 50 RPM. The spin pack is submerged into the acid bath and the coagulating fiber is manually pulled away from the spinneret surface and wound around the spin godet about three times. A glass guide in the spin bath holds the fiber in the spin bath to control the residence time. The submerged fiber length in the spin bath is about 26 inches. The fiber is wound around the first and second stretch rolls about three times and collected on the winder. Fiber is removed from the winder when through collecting and immersed in hot dilute acid solution in order to prepare the fiber for after-treatment. Acid on the surface of the fiber is neutralized by immersing it in 30 weight percent sodium bicarbonate solution. The fiber specimen is put into an automatic wash track and washed with solutions (4 liters each) in the following order (12 cycles):

1. water at 95° C. (four times),
5. solution containing 0.25 weight percent sodium sulfide at 60° C.,
6. water at 60° C.,
7. solution containing 0.03 weight percent sodium hypochlorite at 20° C.,
8. water at 20° C.,
9. solution containing 0.1 weight percent sodium thiosulfate at 60° C.,
10. water at 60° C. (three times).

The washed fiber is allowed to dry.

EXAMPLE 10

Firing

A bicomponent filament is made according to Example 9 and is fired to remove the materials which are not potentially superconducting.

The firing conditions are:

| | |
|---|---|
| Total firing time: | 48 hours |
| Environment: | Pure oxygen |
| Temperature: | 900° C.–1000° C. |
| Pressure: | ½ atm |
| Heat-up time: | 1° C./minute to 300° C. and 2° C./minute to 900° C. |
| Cooling time: | 5° C./minute |

What is claimed is:

1. A process for the production of filaments of potentially superconducting material comprising:
    (a) preparing a liquid suspension which contains at least 10 weight percent potential superconducting material;
    (b) forming multicomponent filaments having a core of the suspension and a viscose sheath which contains cellulose xanthate; and
    (c) thereafter, regenerating cellulose form the cellulose xanthate to form a rayon matrix.

2. The process of claim 1 further comprising:
    (d) after said regenerating, shaping the filaments to a form.

3. The process of claim 2 further comprising:
    (e) firing the shaped filaments to burn off the cellulose and other not potentially superconducting materials.

4. The process of claim 3 wherein said firing is accomplished so that substantially no residue is left of cellulose or other not potentially superconducting materials.

5. The process of claim 3 wherein said firing is accomplished in an oxygen environment.

6. The process of claim 5 wherein said firing is accomplished under sub-atmospheric pressure.

7. The process of claim 2 wherein said shaping is to a form requiring filaments to describe arcs having a radius of less than 1 inch.

8. The process of claim 1 wherein said preparing includes dissolving a thickener in a carrier liquid and dispersing the potentially superconducting material in the carrier liquid.

9. The process of claim 1 further comprising:
    aligning the potentially superconductor material in an axis of electrical conduction using a hyperbolic spinneret capillary.

10. The process of claim 1 wherein said regenerating is in an acidic regeneration bath containing about 17 weight percent $H_2SO_4$, about 20 weight percent $Na_2SO_4$, and 0.2 weight percent $ZnSO_4$.

* * * * *